United States Patent
Tan

(10) Patent No.: US 6,570,185 B1
(45) Date of Patent: *May 27, 2003

(54) STRUCTURE TO REDUCE THE ON-RESISTANCE OF POWER TRANSISTORS

(75) Inventor: Jian Tan, West Lafayette, IN (US)

(73) Assignee: Purdue Research Foundation, West Lafayette, IN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 66 days.

This patent is subject to a terminal disclaimer.

(21) Appl. No.: 08/795,135

(22) Filed: Feb. 7, 1997

(51) Int. Cl.$^7$ .................. H01L 31/0312; H01L 29/76
(52) U.S. Cl. .................. 257/77; 257/329; 257/330
(58) Field of Search .................. 257/77, 328, 329, 257/330

(56) References Cited

U.S. PATENT DOCUMENTS

| 4,587,712 A | * | 5/1986 | Baliga | 29/571 |
|---|---|---|---|---|
| 4,941,026 A | | 7/1990 | Temple | |
| 5,164,325 A | * | 11/1992 | Cogan et al. | 437/29 |
| 5,168,331 A | | 12/1992 | Yilmaz | |
| 5,233,215 A | | 8/1993 | Baliga | |
| 5,250,450 A | * | 10/1993 | Lee et al. | 437/40 |
| 5,393,999 A | | 2/1995 | Malhi | |
| 5,396,085 A | * | 3/1995 | Baliga | 257/77 |
| 5,397,717 A | | 3/1995 | Davis et al. | |
| 5,399,515 A | | 3/1995 | Davis et al. | |
| 5,448,081 A | | 9/1995 | Malhi | |
| 5,451,797 A | | 9/1995 | Davis et al. | |
| 5,459,107 A | | 10/1995 | Palmour | |
| 5,471,075 A | | 11/1995 | Shekar et al. | |

FOREIGN PATENT DOCUMENTS

| EP | 0345380 A | 12/1989 |
|---|---|---|
| EP | 0 676 814 | 10/1995 |
| JP | 5-82792 A | 4/1993 |
| WO | WO 94/13017 A | 6/1994 |

OTHER PUBLICATIONS

Constapel, R., et al.; "Trench–IGBTS with Integrated Diverter Structures"; Proceedings of the 7th International Symposium on Power Semiconductor Devices and IC'S. (ISPSD), Yokohama, May 23–25, 1995, No. Symp. 7, May 23, 1995, Institute of Electrical and Electronic Engineers, pp. 201–206, XP00059458.

Ramungul, N.; "Design and Simulation of 6H–SiC UMOS FET and IGBT for High–Temperature Power Electronics Applications"; Inst. Phys. Conf. Ser. No. 142: Chapter 4, Proceedings of International Conference on Silicon Carbide and Related Materials, Sep. 18–21, 1995; Kyoto, Japan; pp. 773–776, XP002063000.

(List continued on next page.)

Primary Examiner—Tom Thomas
Assistant Examiner—Ori Nadav
(74) Attorney, Agent, or Firm—Summa & Allan, P.A.

(57) ABSTRACT

A power transistor is disclosed that exhibits increased power capacity, reduced on-resistance and prevents current pinch off. The transistor comprises an insulated gate field-effect transistor and including a gate insulator; a protective region having a first conductivity type adjacent the insulator of the transistor for protecting the insulator from the degrading or breakdown effects of a large voltage applied across the device; and a current-enhancing layer having the opposite conductivity type from the protective region and positioned between the protective region and another first conductivity-type region of the transistor.

24 Claims, 2 Drawing Sheets

U.S. PATENT DOCUMENTS

| | | | |
|---|---|---|---|
| 5,486,484 A | | 1/1996 | Malhi |
| 5,488,236 A | | 1/1996 | Baliga et al. |
| 5,506,421 A | | 4/1996 | Palmour |
| 5,514,604 A | | 5/1996 | Brown |
| 5,574,295 A | | 11/1996 | Kurtz et al. |
| 5,689,128 A | * | 11/1997 | Hshieh et al. ............... 257/331 |
| 5,744,826 A | * | 4/1998 | Takeuchi et al. ............... 257/77 |
| 5,981,344 A | * | 11/1999 | Hshieh et al. ............... 438/270 |

OTHER PUBLICATIONS

Baliga, B. J.; "Trends in Power Semiconductor Devices"; IEEE Transactions on Electron Devices, vol. 43, No. 10, Oct. 1996, pp. 1717–1731, XP000626907.

Baliga, B. J.; "Critical Nature of Oxide/Interface Quality for SiC Power Devices"; Microelectronic Engineering, vol. 28, No. 1/04, Jun. 1, 1995, pp. 177–184, XP000513457.

* cited by examiner

STRUCTURE TO REDUCE THE ON-RESISTANCE OF POWER TRANSISTORS

FIELD OF THE INVENTION

The present invention relates to power semiconductor devices and in particular relates to insulated gate devices such as upright metal oxide semiconductor (UMOS) field effect transistors and insulated gate bipolar transistors (IGBTs). This application is related to copending application Ser. No. 08/797,535, filed concurrently herewith to James A. Cooper, Jr. for "Structure For Increasing The Maximum Voltage Of Silicon Carbide Power Transistors" (hereinafter, "the Cooper application"). The Cooper application is incorporated entirely herein by reference.

BACKGROUND OF THE INVENTION

The present invention relates to power semiconductor devices and particularly power MOSFETs (metal-oxide-semiconductor field effect transistors) and IGBTs (insulated gate bipolar transistors). Power MOSFETs and IGBTs are small, reliable, electronically controllable switching devices that have growing application in high voltage/high power devices and integrated circuits. Power MOSFETs and IGBTs have a variety of applications in numerous fields including communications, consumer applications, data processing, military, industrial, automotive, and related markets. In particular, power MOSFETs have inherently higher switching speeds than bipolar transistors and are accordingly particularly useful in high-frequency applications.

The Cooper application referred to and incorporated by reference above describes novel UMOS and IGBT structures that takes greater advantage of the intrinsic properties of silicon carbide (SiC). As set forth in the Cooper application, the intrinsic properties of silicon carbide are such that it can theoretically handle a peak electric field eight times higher than can silicon, leading to the possibility that silicon carbide switching devices can be fabricated with drift regions eight times thinner than comparable silicon devices, with doping of the drift regions being about twelve times higher. Because the resistance of the drift region is proportional to the thickness and inversely proportional to the doping, the specific on resistance of a silicon carbide device can be from 100–200 times smaller than a comparable silicon device of equal voltage rating. This means that the silicon carbide device can be 100–200 times smaller than the comparable silicon device. Alternatively, if the silicon carbide device is formed with the same area as the comparable silicon device, the specific on-resistance of the silicon carbide device will be about 100–200 times lower than the silicon device.

As further set forth in the Cooper application, these theoretical advantages of silicon carbide have not yet been reached because the maximum voltage in silicon carbide MOSFETs is limited by the breakdown field of the silicon dioxide ($SiO_2$) insulator rather than by the silicon carbide itself. Although the oxide may not actually fail until fields of about $10^7$ volts per centimeter (V/cm) are reached, in reality the long term reliability of the oxide degrades severely above about $2-3\times10^6$ V/cm. Thus, the capability of the oxide is already less than the theoretical breakdown field of silicon carbide. Furthermore, the dielectric constants of silicon dioxide and silicon carbide exasperate the problem. In particular, their exists a 2.5:1 ratio between the dielectric constant of silicon dioxide and silicon carbide. Accordingly, Gauss' law requires that the maximum field in the silicon carbide portion of a device be limited to around $1\times10^6$ V/cm to avoid reaching the breakdown limit in the oxide.

As a result of all of these factors, silicon carbide power transistors are practically limited to a blocking voltage much lower than that of which silicon carbide is theoretically capable.

The Cooper application addresses this problem by incorporating a protective layer beneath the bottom of the trench adjacent to the insulator (typically silicon dioxide). This protective region protects the field insulator in the trench from the degrading or breakdown effects of a large positive voltage applied to the drain. Thus, the additional p-type layer described in the Cooper application protects the oxide so that the device can make the maximum usage of silicon carbide's high breakdown field. The Cooper application also sets forth the results of device simulation carried out using a commercially available simulation software package. The simulation confirms that the p-type layer protects the oxide in the intended manner.

This simulation also indicates, however, that the protection offered by the additional p-type layer at the bottom of the trench increases as the distance ("d" in FIGS. 1 and 2) along the trench wall between the p-type layer of the transistor and the p-type protection layer decreases. Stated in the alternative, the protective effect on the oxide is better when these two p-type portions of the Cooper device are closer to one another.

As a proviso noted in the Cooper application, however, decreasing this distance between the two p-type regions tends to encourage pinch-off between them which can eventually block all current at forward bias. Basic calculations indicate that for typically useful doping concentrations in the p and n-type portions of the UMOS e.g. ($p=2\times10^{17}$ $cm^{-3}$, $n=2.5\times10^{15}$ $cm^{-3}$), pinch off will occur when the distance between the two p-type portions is less than about 1.5 microns.

Obtaining a 1.5 micron gap, however, presents some problems. First, from a processing standpoint, physically defining such a distance requires that the trench be etched to a depth of about 3 microns. Accordingly, if aluminum is used in typical fashion as a reactive ion etching (RIE) mask, at least about 6750 Å of aluminum will be theoretically required. In reality, however, because of the thickness variation of aluminum deposition and etch rate variation during RIE, 8,000 Å of aluminum would be typically necessary for a safe mask. The aluminum mask then would need to be removed using lift off technology in order to keep straight sidewalls in the trench. Lifting off an 8,000 Å layer of aluminum is technically difficult, however, and is best avoided if at all possible.

Alternatively, if the two p-type layers are spaced 1.5 microns or more apart to minimize the processing problems, the greater distance will correspondingly minimize the protective effect for which the additional $p^+$ layer is included in the structure.

Accordingly, there exists a need to tailor the geometry of the structures disclosed in the Cooper application to minimize the possibility of pinching off the current and to avoid technical difficulties in masking and etching deep trenches solely for the purpose of establishing a minimum distance between the p-type layers.

OBJECT AND SUMMARY OF THEN INVENTION

Therefore, it is an object of the present invention to provide an insulated gate structure that minimizes the possibility of pinching off the current while at the same time taking advantage of the full capabilities of UMOS and IGBT structures, particularly in silicon carbide.

The invention meets this object with an insulated gate transistor that exhibits increased power capacity, reduced on resistance, and prevents current pinch-off. In one aspect, the invention comprises a UMOS field-effect transistor, including a trench and a trench oxide on the walls and bottom of the trench. A protective region is beneath the bottom portion of the trench oxide of the transistor for protecting the trench oxide from the degrading or breakdown effects of a large voltage applied across the device. A current enhancing layer is between the protective region and the channel of the insulated gate structure, and the current enhancing layer is preferably more heavily doped than the remainder of the n-type drain region of the transistor.

The foregoing and other objects, advantages and features of the invention, and the manner in which the same are accomplished, will be more readily apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENTS

Figure 1:
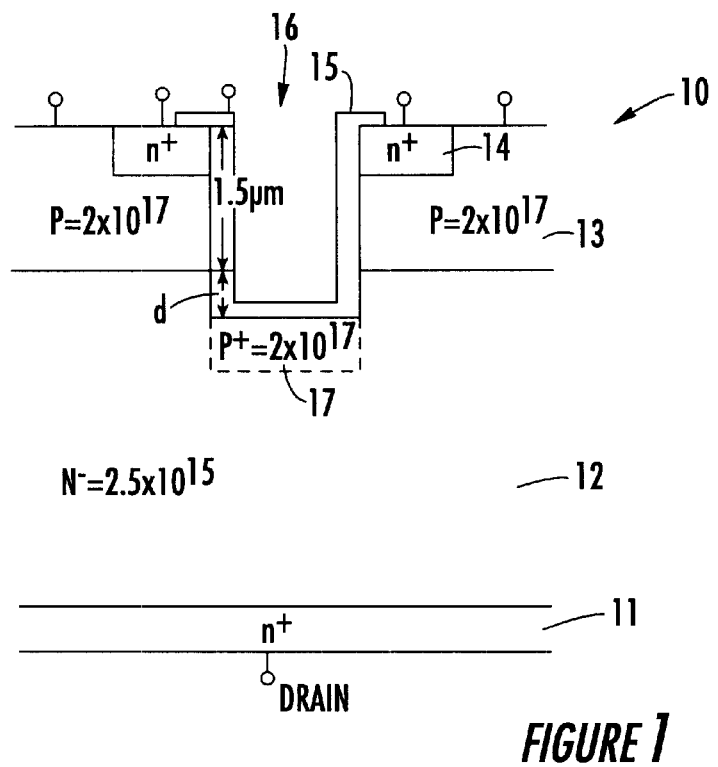
FIG. 1 is a cross-sectional view of a UMOS according to the copending Cooper application.

In a first embodiment, the present invention is a UMOS that exhibits increased power capacity, reduced on resistance and prevents current pinch-off. The UMOS of the present invention is based on the UMOS disclosed and claimed in the copending Cooper application ("the Cooper UMOS"), and which is schematically illustrated in cross-section at 10 in FIG. 1. As illustrated therein, the Cooper UMOS comprises an n-type silicon carbide substrate 11, an n-type silicon carbide epitaxial layer 12, a p-type epitaxial layer 13, and an n-type well 14. A gate oxide 15 covers the trench which is broadly designated at 16. The Cooper UMOS further includes the grounded p-type layer 17 along the bottom of the trench 16. As set forth in the Cooper application, the additional p-type layer 17 protects the oxide 15 from the effects of high electric fields. As also noted in the Cooper application and discussed immediately above, the addition of the p-layer 17 can create a current pinching-effect between it and the p-type epitaxial layer 13 of the UMOS structure 10.

Figure 2:
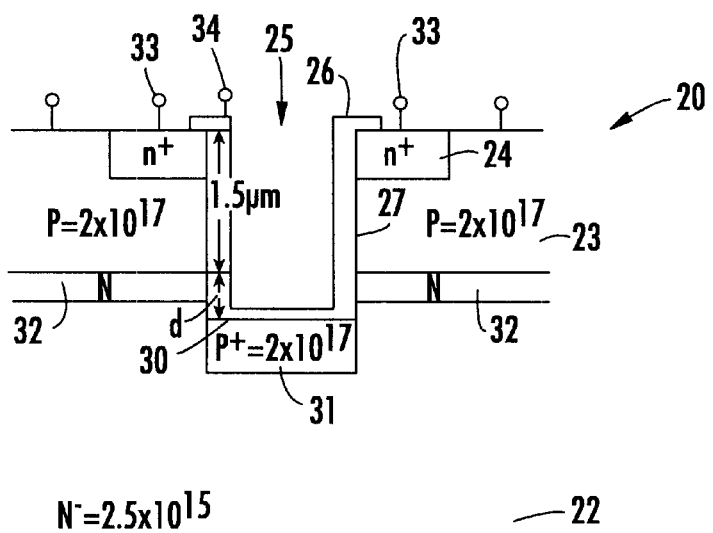
FIG. 2 is a cross-sectional view of a UMOS according to the present invention.

FIG. 2 illustrates the present invention in the form of an upright metal oxide semiconductor p-channel enhancement type field effect transistor broadly designated at 20. Although the Cooper structure of FIG. 1 is designed to particularly take advantage of the properties of silicon carbide, the present invention offers advantages for devices in both silicon and silicon carbide. With this understanding, however, the remainder of the description will be made in terms of silicon carbide.

FIG. 2 illustrates that the UMOS 20 of the invention includes an n-type silicon carbide substrate 21 with an n-type silicon carbide epitaxial layer 22 on the n-type substrate. As FIG. 2 illustrates with the $n^+$ and $n^-$ designations, in preferred embodiments the substrate 21 that meets the drain contact is more heavily doped than the epitaxial layer 22, to enhance the current flow to the drain. It will be understood that under some circumstances, a single substrate can take the place of the substrate 21 and the epilayer 22. The $n^+/n^-$ structure, however, offers certain current-flow advantages, and is thus generally preferred.

A p-type epitaxial layer 23 forms the channel region of the UMOS 20 and an n-type well 24 forms the source.

FIG. 2 also illustrates the trench 25 and the gate oxide 26 that covers the walls. 27 and bottom 30 of the trench 25.

As in the Cooper UMOS, the invention includes the grounded p-type region 31 between the oxide 26 and the n-type epitaxial layer 22 and that is aligned with the bottom 30 of the gate trench 25 for protecting the oxide 26 in the trench 25 from the degrading or breakdown affects of a large positive voltage applied to the drain.

The UMOS of the present invention, however, further comprises the current enhancing n-type layer 32, preferably an $n^+$-type layer, between the grounded p-type region 31 and the p-type channel region 23 of the UMOS structure 20. The current enhancing n-type layer 32 is preferably more heavily doped than the remainder of the n-type epitaxial layer 22.

FIG. 2 also illustrates the source contacts 33, the gate contact 34 and the drain contact 35.

By placing the current enhancing n-type layer 32 underneath the p-type channel layer 23, the structure avoids current pinch off even at much smaller distances. (d) between the p-type channel portion 23 and the grounded p-type region 31.

For example, the same calculations that demonstrate pinch off occurring at distances (d) of 1.5 microns or less in a structure such as FIG. 1 demonstrate that pinch off can be avoided using the invention for distances (d) of as little as 0.18 microns.

Accordingly, if the distance d can be made somewhat smaller, the processing of the structure can be made correspondingly easier while at the same time strengthening the protective effect of the $p^+$ layer 31.

Additionally, the current enhancing layer 32 also helps 30 to reduce the drain resistance at forward bias. In the absence of the-additional n-type layer 32, the current spreading out from the bottom of the trench corner to the drain creates a large spreading resistance around the trench corner. By adding the n-type layer 32, the current can first flow laterally inside the n-type layer, and then flow down to the drain, thus minimizing or eliminating the spreading resistance under forward bias.

The MEDICI™ device simulation program referred to in the Cooper application was used to check the behavior of the structure of the present invention. The simulation demonstrated that at a concentration of about $2\times10^{17}$ $cm^{-3}$ in the n-type current enhancing layer 32, and a distance d of 0.18 microns between the two p-type portions 23 and 31, no pinch off occurs and forward current increases by a factor of about 10. It will be understood that the doping concentration and the thickness of the n-type layer 32 should be designed carefully so that the n-type layer 32 can effectively strengthen the protective effect of the grounded p-type layer 31 while at the same time still providing the maximum usage of the n region 22 to block reverse voltage drop.

In summary, the addition of the n-type layer 32 serves at least two purposes. First, it prevents pinch off even for a very small d thus in turn strengthening the protective effect of the grounded p-type layer 31 at reverse bias. Second, the n-type layer 32 reduces the on resistance at forward bias. As noted above, preliminary two-dimensional MEDICI™ simulation appears to verify these two advantages.

From a processing standpoint, the addition of the n-type layer 32 is relatively straightforward in that it requires simply growing one more epitaxial layer while using the identical mask design and processes that are used to make the Cooper UMOS illustrated in FIG. 1.

As some additional details, in preferred embodiments, the n-type substrate 21 typically has a carrier concentration of about $2 \times 10^{19}$ cm$^{-3}$. The n-type epitaxial layer 22 generally has a carrier concentration of between about $2.5 \times 10^{15}$ cm$^{-3}$ and $2 \times 10^{16}$ cm$^{-3}$. The current enhancing n-type epitaxial layer 32 preferably has a carrier concentration about $2 \times 10^{17}$ cm$^{-3}$. The p-type epitaxial layers 23 and the grounded p-type region 31 typically have carrier concentrations of between $2 \times 10^{17}$ cm$^{-3}$ and $5 \times 10^{17}$ cm$^{-3}$.

As discussed in the Cooper application, when the semiconductor is silicon carbide, the grounded p-type region 31 is typically an implanted region doped with aluminum or boron. Additionally, in the silicon carbide embodiments, the preferred n-type dopant is nitrogen and the preferred dopant for the p-type epilayer 23 is also aluminum.

When the structure is formed in silicon, the preferred p-type dopant is boron, and the preferred n-type dopants are phosphorous, arsenic, and antimony.

In the silicon carbide embodiments, the ohmic contacts 33 and 35 to the n-type well 24 and n-type substrate 21 are generally selected from the group consisting of nickel and nickel alloys, while the p-type region 31 is grounded through an ohmic contact (not shown) selected from the group consisting of aluminum and aluminum alloys and cobalt silicide (CoSi$_2$)

In another aspect, the UMOS of the present invention can be described by the structure of the trench 25. This structure comprises the trench wall 27 and the grounded p-type region 31 that forms the trench bottom 30. The trench wall 27 and trench bottom 30 are covered by the gate oxide 26 of the UMOS 20. The trench wall 27 beneath the oxide 26 in turn comprises the n$^+$ well 24 for the source, the p-type epitaxial layer 23 for the channel positioned beneath the n$^+$ type well 24, the current enhancing n-type type layer 32 beneath the p-type epitaxial layer 23, and the n-type drain region 22 (together with the substrate 21) beneath the current enhancing n-type layer 32. As in the other embodiments, the n-type drain region 22 is less heavily doped than the current enhancing n-type layer 32.

In another embodiment, the invention comprises an insulated gate bipolar transistor (IGBT) formed in silicon carbide with silicon dioxide as the gate insulator. The transistor has a source with a first conductivity type, a protective region adjacent the gate oxide and that has the opposite conductivity type from the source for protecting the gate oxide from the degrading or breakdown effects of a large voltage applied across the transistor, and a current enhancing layer having the first conductivity type and positioned between the protective region and the source region of the transistor.

Figure 3:
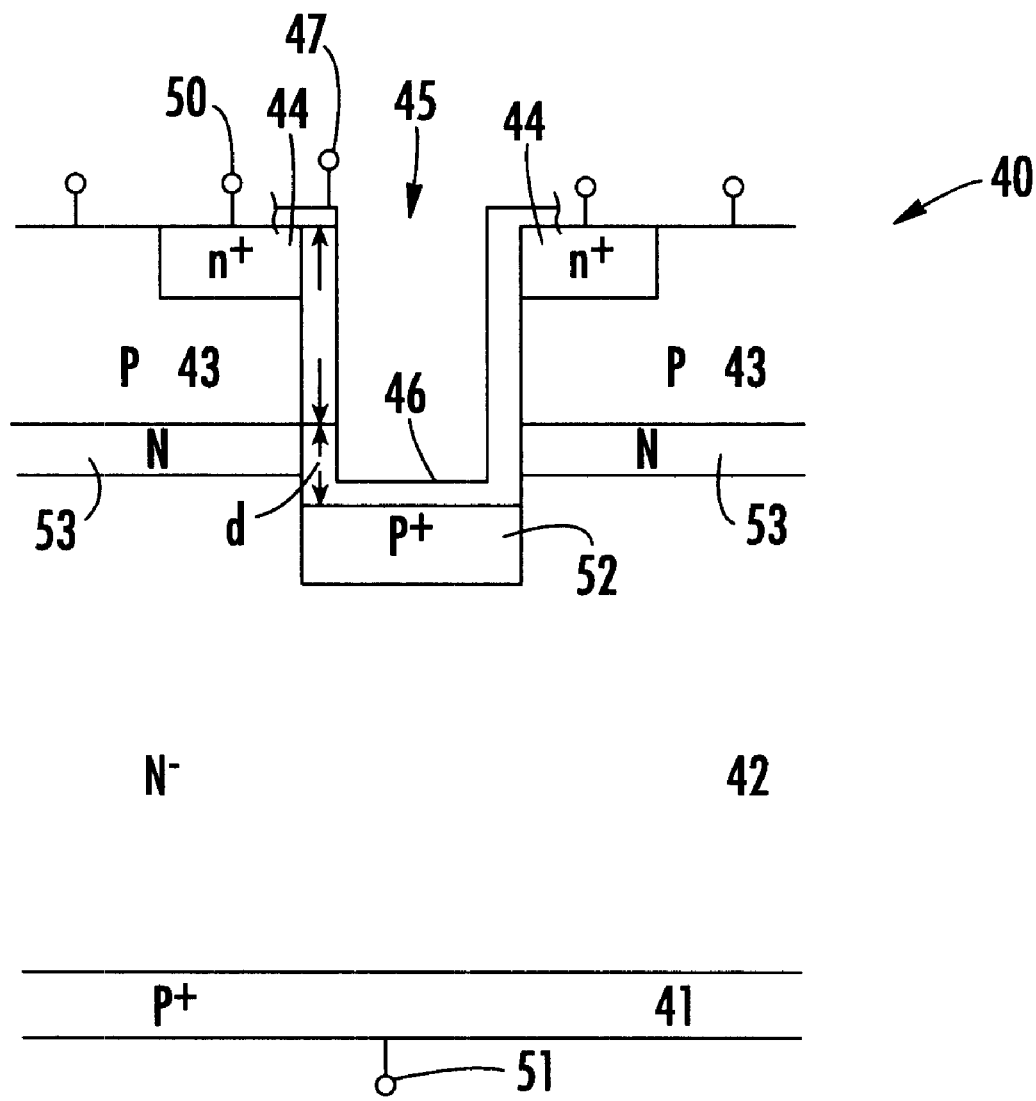
FIG. 3 is a cross-sectional view of an IGBT according to the present invention.

FIG. 3 illustrates a particularly preferred IGBT embodiment broadly designated at 40. The IGBT 40 comprises a p-type silicon carbide substrate 41, an n-type silicon carbide epitaxial layer 42 on the p-type substrate 41, a p-type silicon carbide epitaxial layer 43 on the n-type epitaxial layer 42, an n-type well 44 in the p-type epitaxial layer 43, and a gate trench broadly designated at 45 extending through the n-type well 44, the p-type epitaxial layer 43, and terminating in then-type epitaxial layer 42. A gate oxide 46 is on the walls and bottom of the trench 45 and respective ohmic contacts 47, 50 and 51 are made to the gate oxide 46, to the n-type well 44 and to the p-type substrate 41 for respectively defining the gate, the source, and the emitter. A p-type silicon carbide protective region 52 is between the oxide 46 and the n-type epitaxial layer 42 and is aligned with the bottom of the gate trench 45 for protecting the oxide 46 in the trench 45 from the degrading or breakdown affects of a large, positive voltage applied across the IGBT 40.

An n-type current enhancing layer 53 is positioned between the protective region 52 and the source 44.

As in previous embodiments, the p-type protective region 52 is preferably grounded with an ohmic contact selected from the group consisting of aluminum, aluminum alloys and cobalt silicide and is preferably formed by ion implantation.

The ohmic contacts to the n-type well 44 are preferably selected from the group consisting of nickel and nickel alloys. The n-type well 44, n-type epitaxial layer 42 and n-type current enhancing layer 53 are all preferably doped with nitrogen, and the preferred dopant for the p-type epitaxial layer 43 is selected from the group consisting of aluminum and boron.

As in the other embodiments, the silicon carbide preferably has a polytype selected from the group consisting of 4H and 6H.

In the drawings and specification, there have been disclosed typically preferred embodiments of the invention and, although specific terms have been employed, they have been used in the generic sense and descriptive sense only, and not for purposes of limitation, the scope of the invention being set forth in the following claims.

That which is claimed:

1. A silicon carbide UMOS that exhibits increased power capacity, reduced on-resistance, and prevent current pinch-off, said UMOS comprising:

an upright metal oxide semiconductor field-effect transistor formed in silicon carbide and including a trench and a trench insulator on the walls and bottom of said trench;

a directly grounded protective region having a first conductivity type and positioned beneath the bottom portion of said trench insulator of said transistor for protecting said trench insulator from the degrading or breakdown effects of a large voltage applied across the device; and a current-enhancing layer having the opposite conductivity type from said protective region and said current-enhancing layer positioned apart from said protective region between said protective region and the channel of said UMOS structure.

2. A UMOS power transistor according to claim 1 wherein said current-enhancing layer being more heavily doped than the remainder of the drain region of said transistor.

3. A UMOS power transistor according to claim 1 wherein said protective region is aligned with the bottom of the UMOS trench.

4. A UMOS power transistor according to claim 3 wherein said protective region is an implanted region.

5. A silicon carbide UMOS power transistor according to claim 1 wherein said silicon carbide has a polytype selected from the group consisting of 4H and 6H.

6. A silicon carbide UMOS power transistor according to claim 1 wherein said insulator comprises silicon dioxide.

7. A silicon carbide UMOS power transistor that demonstrates increased maximum voltage, reduced on resistance and prevents current pinch off, said transistor comprising:
- a silicon carbide substrate having a first conductivity type;
- an opposite-type epitaxial layer on said substrate;
- a first conductivity-type well in said epitaxial layer;
- a gate trench extending through said well and said epitaxial layer and terminating in said substrate;
- a gate insulator on the walls and bottom of said trench;
- respective ohmic contacts to said gate insulator for defining a gate, to said well for defining a source, and to said substrate for defining a drain;
- a directly grounded opposite conductivity-type region between said insulator and said substrate and aligned with the bottom of said gate trench for protecting said insulator in said trench from the degrading or breakdown effects of a large voltage applied across the device;
- a current enhancing first conductivity-type layer between said protective region and the channel of said UMOS structure, said current enhancing layer being more heavily doped than the remainder of the said substrate and positioned apart from said protective region.

8. A UMOS power transistor according to claim 7 wherein said first conductivity type is p and said opposite conductivity type is n.

9. A UMOS power transistor according to claim 7 wherein said first conductivity type is n and said opposite conductivity type is p.

10. A UMOS power transistor according to claim 7 wherein said insulator is silicon dioxide.

11. A silicon carbide UMOS power transistor that demonstrates increased maximum voltage, reduced on-resistance and prevents current pinch off, said transistor comprising;
- an N-type silicon carbide substrate;
- an N-type epitaxial layer on said N-type substrate;
- a P-type epitaxial layer on said N-type epitaxial layer;
- an N-type well in said P-type epitaxial layer;
- a gate trench extending through said N-type well and said P-type epitaxial layer and terminating in said N-type epitaxial layer;
- a gate oxide on the walls and bottom of said trench;
- respective ohmic contacts to said gate oxide for defining a gate, to said N-type well for defining a source, and to said substrate for defining a drain;
- a directly grounded P-type protective region between said oxide and said N-type epitaxial layer and aligned with the bottom of said gate trench for protecting said oxide and said trench from the degrading or breakdown effects of a large positive voltage applied across the device;
- a current-enhancing N-type layer between said P-type region and the channel of said UMOS structure, said current-enhancing N-type layer being more heavily doped than the remainder of said N-type epitaxial layer and positioned apart from said P-type protective region.

12. A UMOS power transistor according to claim 11 wherein said n-type substrate is more heavily doped than said n-type epitaxial layer.

13. A UMOS power transistor according to claim 11 wherein said n-type substrate has a carrier concentration of about $2 \times 10^{19}$ cm$^{-3}$.

14. A UMOS power transistor according to claim 13 wherein said n-type epitaxial layer has a carriers concentration between about $2.5 \times 10^{15}$ cm$^{-3}$ and $2 \times 10^{16}$ cm$^{-3}$.

15. A UMOS power transistor according to claim 13 wherein said current-enhancing n-type epitaxial layer has a carrier concentration of about $2 \times 10^{17}$ cm$^{-3}$.

16. A UMOS power transistor according to claim 11 wherein said p-type epitaxial layer has a carrier concentration between about $2 \times 10^{17}$ cm$^{-3}$ and $5 \times 10^{17}$ cm$^{-3}$.

17. A UMOS power transistor according to claim 11 wherein said grounded p-type region has a carrier concentration between about $2 \times 10^{17}$ cm$^{-3}$ and $5 \times 10^{17}$ cm$^{-3}$.

18. A UMOS power transistor according to claim 11 wherein said grounded p-type region is an implanted region.

19. A silicon carbide UMOS power transistor according to claim 11 wherein the silicon carbide has a polytype selected from the group consisting of 4H and 6H.

20. A silicon carbide UMOS power transistor according to claim 19 wherein said ohmic contacts to said n-type well and said n-type substrate are selected from the group consisting of nickel and nickel alloys.

21. A silicon carbide UMOS power transistor according to claim 19 wherein said grounded p-type region is grounded through an ohmic contact selected from the group consisting of aluminum, aluminum alloys, and cobalt silicide.

22. A silicon carbide UMOS power transistor according to claim 19 wherein said n-type well, said n-type epitaxial layer, said current-enhancing n-type layer, and said n-type substrate are all doped with nitrogen.

23. A silicon carbide UMOS power transistor according to claim 19 wherein said p-type epitaxial layer is doped with aluminum or boron.

24. A silicon carbide UMOS structure comprising:
- a trench wall; and
- a p-type trench bottom;
- said trench wall and trench bottom being covered by the gate oxide of said UMOS;
- said trench wall beneath said oxide comprising,
  - a n+ type well for the source,
  - a p type epitaxial layer for the channel beneath said n+ type well,
  - a current enhancing n-type layer beneath said p type epitaxial layer, and
  - a n-type drain region beneath said current enhancing n-type layer, said n type drain region being less heavily doped than said current enhancing n-type layer.

* * * * *